United States Patent [19]
Kato et al.

[11] Patent Number: 5,742,176
[45] Date of Patent: Apr. 21, 1998

[54] METHOD OF MEASURING A FE-B CONCENTRATION OF A SILICON WAFER

[75] Inventors: Hirotaka Kato; Kei Matsumoto, both of Hiratsuka, Japan

[73] Assignee: Komatsu Electronic Metals Co., Ltd., Hiratsuka, Japan

[21] Appl. No.: 603,083

[22] Filed: Feb. 20, 1996

[51] Int. Cl.$^6$ .................................................. G01R 31/26
[52] U.S. Cl. ............................................................. 324/765
[58] Field of Search ................................ 324/765; 437/8; 257/40, 48

[56] References Cited

U.S. PATENT DOCUMENTS

| | | | |
|---|---|---|---|
| 4,598,249 | 7/1986 | Goodman et al. | 324/752 |
| 4,841,239 | 6/1989 | Foell et al. | 324/765 |
| 5,369,495 | 11/1994 | Lagowski | 356/418 |
| 5,661,408 | 8/1997 | Kamieniecki et al. | 324/765 |

OTHER PUBLICATIONS

29p-ZD-9; "Fe-B Concentration Measurement by SPV Method"; Extended Abstracts (The 41st Spring Meeting, 1994); The Japan Society of Applied Physics and Related Societies.

"Heavy Metal Contamination Measurement by sPV Method"; Date: Nov. 5, 6, and and 9, 1992 Place: 10F, Head office bldg. of Japan EDE Co. Lecturer: Dr. Lubek Jestrzebski, The vice-president of SDI and a professor of South Florida University Microelectronics Center.

*Primary Examiner*—Vinh P. Nguyen
*Assistant Examiner*—Russell M. Kobert
*Attorney, Agent, or Firm*—Varndell Legal Group

[57] ABSTRACT

An evaluation method of a silicon wafer by correctly calculating the Fe—B concentration is disclosed. Even when the SPV method is utilized, the over-estimated Fe—B concentration in silicon wafers containing oxygen-precipitation defects can be avoided. Diffusion lengths Lb and La of minority carriers in a P-type silicon wafer before and after an activation step are measured by the SPV method. A value of (Lb—La)/Lb calculated from La and Lb is compared with a constant C which is read from the plot of Lb vs. (Lb—La). If (Lb—La)/Lb is smaller than constant C, the concentration calculation is terminated since there are oxygen-precipitation defects in the silicon wafer. The calculation is carried out for silicon wafers containing no oxygen-precipitation defects, and is based on the formula of Fe—B concentration $(cm^{-3}) \approx 1 \times 10^{16}(La^{-2} - Lb^{-2})$. Therefore, the Fe—B concentration can be precisely determined even though the silicon wafers in which a high-density of oxygen-precipitation defects exist are mixed together with silicon rods.

4 Claims, 3 Drawing Sheets

METHOD OF MEASURING A FE-B CONCENTRATION OF A SILICON WAFER

BACKGROUND OF THE INVENTION

Field of the Invention The present invention relates to a method of measuring a Fe—B (iron-boron) concentration in a silicon wafer, and more specifically, to an evaluation method of a silicon wafer by analysis of Fe—B content.

DESCRIPTION OF RELATED ARTS

Two methods have been developed to measure Fe—B concentration in a silicon wafer. The first one forms Schottky contacts or P/N contacts on the surface of the silicon wafer, and then utilizes Deep Level Transient Spectroscopy (DLTS) to measure the deep-level density contributed by Fe—B. The second one is known as the surface photovoltage (SPV) method. The SPV method activates the surface of the silicon wafer by irradiating light to cause optical excitation or by heating the wafer at a temperature of about 200° C. The diffusion length, which is determined by the dissociated Fe—B content, differs before and after the activation of the wafer surface. Therefore, the Fe—B concentration can be obtained by measuring the variation of the diffusion length.

FIG. 4 depicts a process flow of the SPV method for measuring the Fe—B concentration in a silicon wafer. First, the silicon wafer for Fe—B measurement is provided (step 11). The diffusion length Lb of the minority carriers in the silicon wafer is measured (step 12). Next, the silicon wafer is heated to a temperature of about 200° C. to dissociate the combined Fe—B according to the equation of Fe—B→$Fe_{int}$+$B_{sub}$, and then rapidly cooled down to room temperature (step 13). The diffusion length of dissociated minority carriers is measured as La (step 14). Finally, the Fe—B concentration can be calculated from the values of La and Lb (step 15). The formula for calculating the Fe—B concentration from La and Lb is [Fe—B]≈$1\times10^{16}(La^{-2}-Lb^{-2})$, wherein the unit of the Fe—B concentration is $cm^{-3}$ and those of La and Lb are μm. Therefore, the Fe—B concentration can be obtained by the SPV method and with a sensitivity of as high as $10^8\ cm^{-3}$.

However, several problems exist with the DLTS and SPV methods. When the DLTS method is utilized, the processes of Schottky or P/N contact formation and the concentration measurement require quite a long time. For example, the time required for forming a contact by vapor deposition is about one hour, and that for measuring the concentration under a specific condition is even longer than one hour, thus decreasing efficiency.

With the SPV method, the calculated Fe—B concentration will much higher than the real concentration in silicon wafers which contain oxygen-precipitation defects. A comparison of the Fe—B concentrations obtained from use of the DLTS and SPV methods is depicted in FIG. 3. As shown in the figure, the silicon wafers which have been heated to a temperature of about 650° C. for removing oxygen donors therein and been processed by a general heat step at a temperature of about 1000° C., the wafers which have been processed by a two-step heat treating to form an intrinsic gettering structure therein, and the wafers containing polysilicon and/or epitaxial silicon therein, have almost identical measurement results from use of the DLTS and the SPV methods. However, for the wafers containing oxygen-precipitation defects, as marked by Δ, the calculated Fe—B concentration from the SPV method is obviously higher than the measured concentration from the DLTS method. That is, the diffusion length La and Lb of the minority carriers cannot be correctly obtained if the recombination centers (such as the oxygen-precipitation defects, Fe—B, Fe between lattices, etc.) of the carriers do not distribute uniformly along the direction of the wafer thickness. For example, when denuded-zone layers exist on both surfaces of a silicon wafer which has been processed by a multi-step heat treatment to form intrinsic getterings therein, the distribution of oxygen-precipitation defects will not be uniform, thus affecting the measurement of diffusion length La and Lb. Moreover, even though the denuded-zone layers can be removed to assure a uniform distribution of the recombination centers along the direction of thickness of the wafer, the measurement is not reliable since recombination centers, other than the Fe—B, will be generated during the 200° C. activation step of the wafer.

SUMMARY OF THE INVENTION

Accordingly, the present invention provides a method to prevent the great variance of calculated Fe—B concentration by the SPV method and to calculate the Fe—B concentration in silicon wafers which contain no oxygen-precipitation defects, whereby the Fe—B concentration in the silicon wafers can be calculated accurately.

The present invention provides a method of measuring the Fe—B concentration in a P-type silicon wafer. The method measures a diffusion length Lb of minority carriers in associated Fe—B in a P-type silicon wafer by the surface photovoltage method. The method also measures a diffusion length La of minority carriers in a silicon wafer which has been activated to form dissociated $Fe_{int}$+$B_{sub}$ and then cooled rapidly. The Fe—B concentration can be calculated from the measured La and Lb. The method is characterized in that oxygen-precipitation defects are proved to exist in the silicon wafer if the value of (Lb—La)/Lb is smaller than a predetermined value obtained from the plot of Lb and Lb—La relationships, and the calculation of the Fe—B concentration of the silicon wafer is terminated instead of proceeding further. And if the value of (Lb—La)/Lb is equal to and larger than a predetermined value obtained from the plot of Lb and Lb—La relationships, the calculation of the Fe—B concentration of the silicon is proceed.

As mentioned above, the diffusion lengths Lb and La, which are obtained by SPV measurement of the P-type silicon wafer before and after the activation step, respectively, are utilized to find the value of (Lb—La)/Lb. The value of (Lb—La)/Lb is compared with a predetermined value on the plot of Lb and Lb—La to determine if oxygen-precipitation defects exist in the wafer or not. Therefore, only the silicon wafers containing no oxygen-precipitation defects are subjected to calculation of the Fe—B concentration therein. Thus, the Fe—B concentration can be precisely determined even though the wafers in which a high-density of oxygen-precipitation defects exist, are mixed together therewith.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE INVENTION

Figure 1:
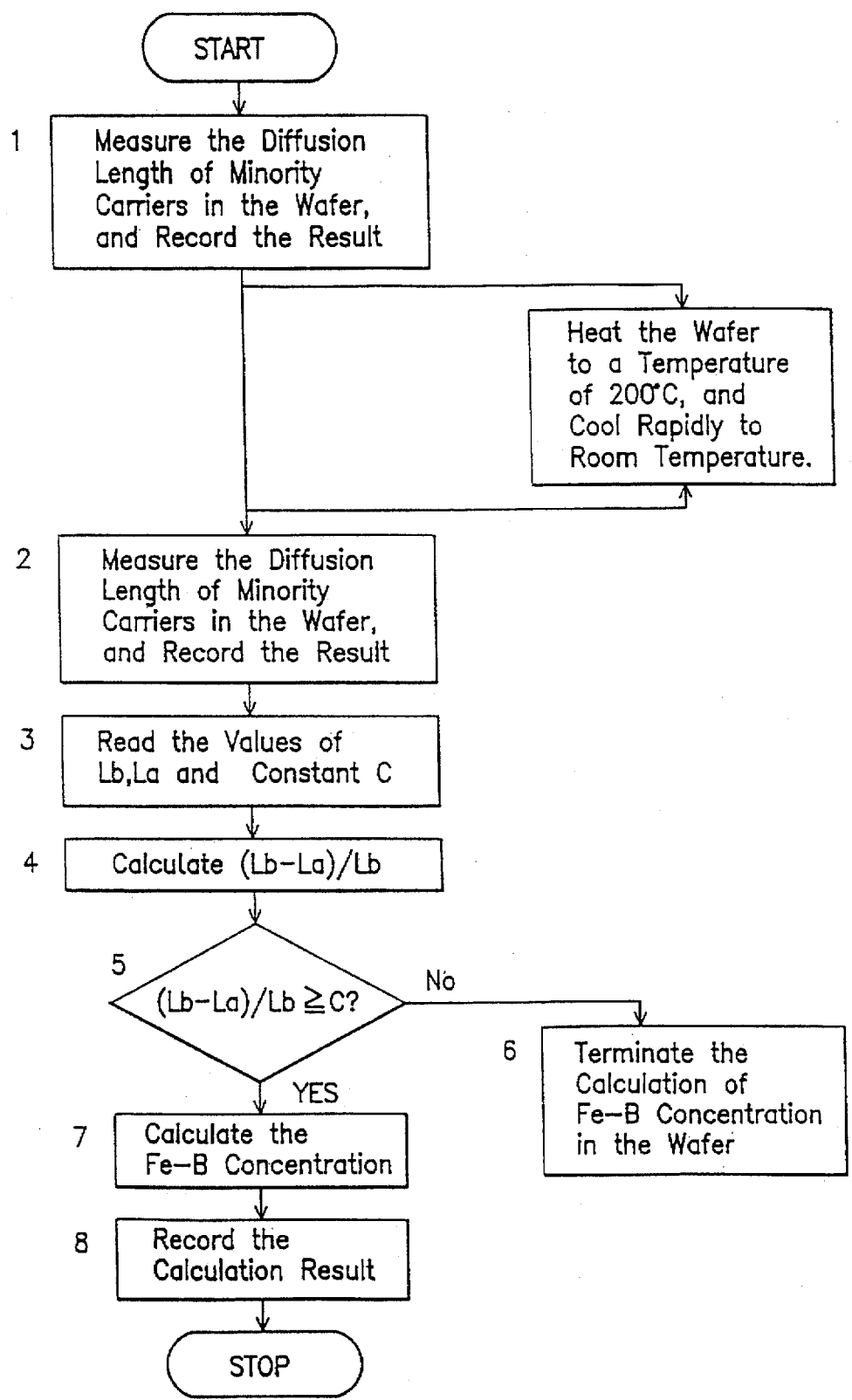
FIG. 1 is a flow chart illustrating the control of the Fe—B concentration calculation when the SPV method is carried out in a silicon wafer.

FIG. 1 illustrates a flow chart of the control of the Fe—B concentration calculation when the SPV method is carried out in a silicon wafer according to the preferred embodiment of the invention. The silicon wafer provided in the present embodiment can be a P-type silicon wafer which has been doped with boron. The effective resistivity of the silicon wafer is preferably higher than 0.05 $\Omega$.cm that suitable for Fe—B concentration measurement by the SPV method.

Figure 2:
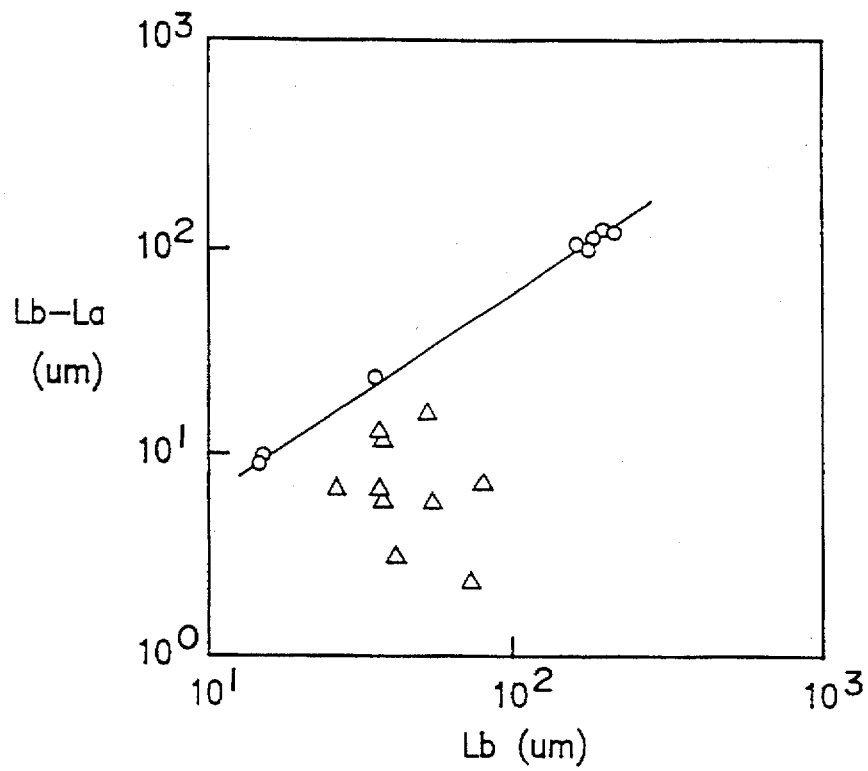
FIG. 2 is a plot of value Lb versus value (Lb—La), wherein values Lb and La are diffusion lengths of minority carriers in a silicon wafer before and after an activation step, respectively.
Figure 3:
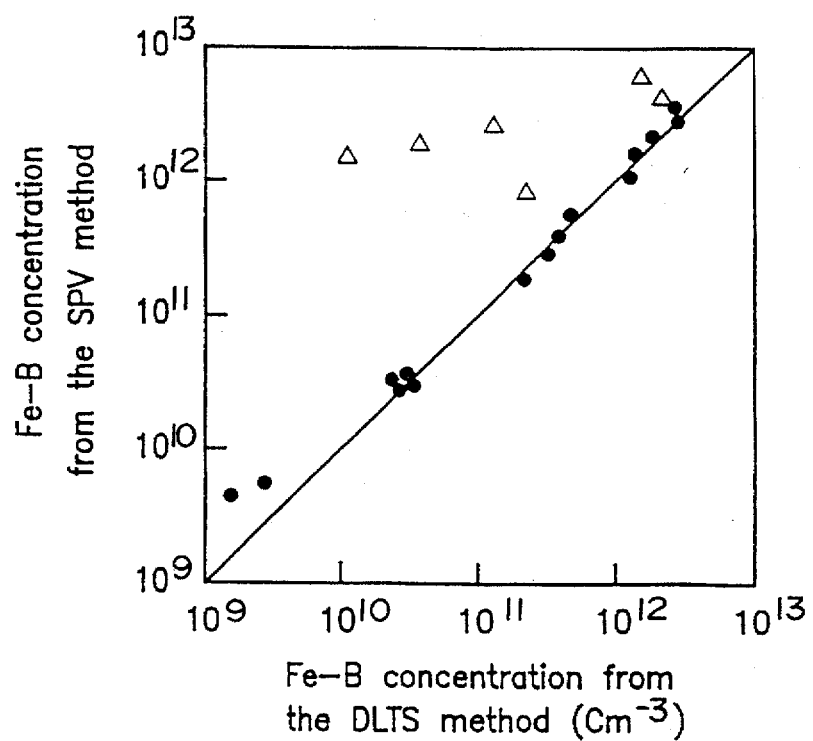
FIG. 3 is a schematic diagram illustrating the comparison of Fe—B concentrations obtained by the DLTS method and the SPV method, respectively.
Figure 4:
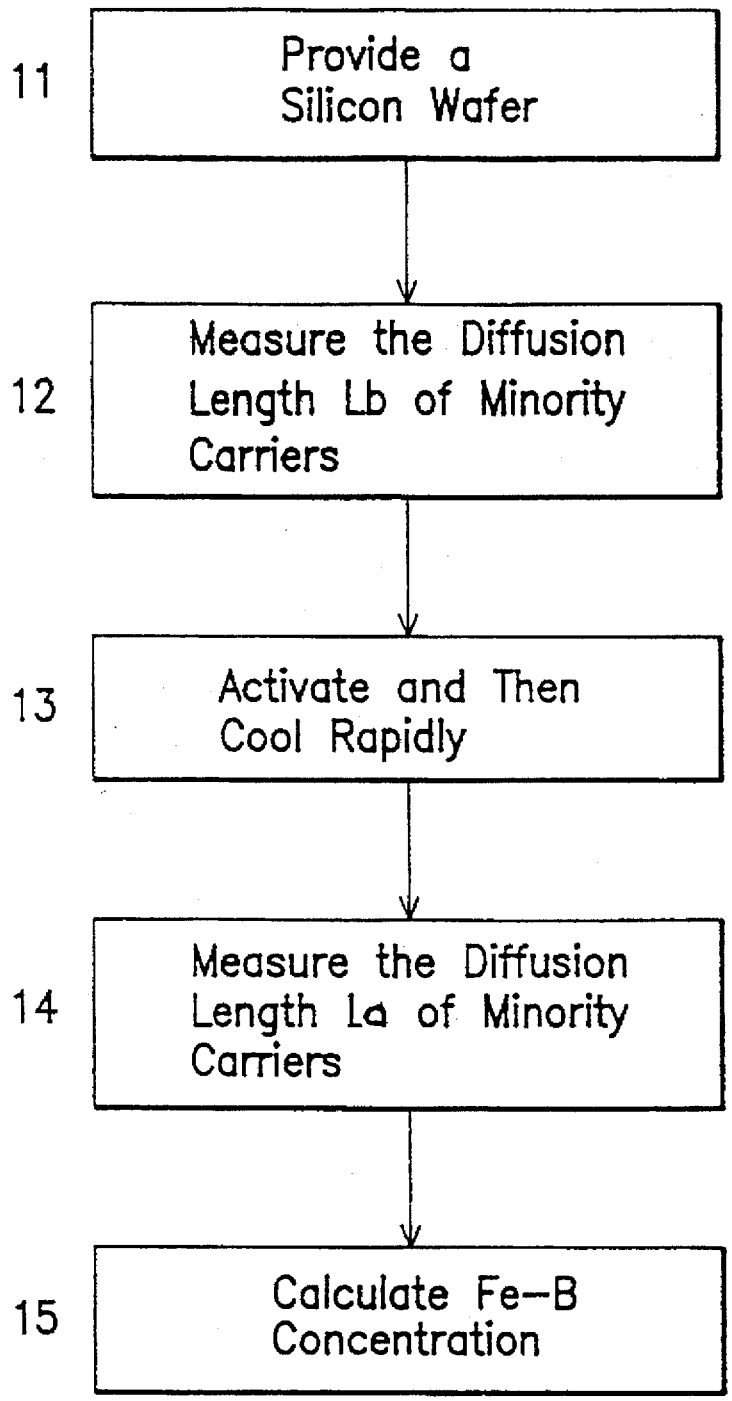
FIG. 4 is a flow chart of a conventional SPV method for measuring the Fe—B concentration of a silicon wafer.

Referring to FIG. 1, in step 1, the silicon wafer containing combined Fe—B is subjected to measurement of the diffusion length of the minority carriers therein, and the result, i.e., diffusion length Lb, is recorded. The silicon wafer is then activated by heating it to a temperature of about 200° C., and is cooled rapidly to room temperature. The Fe—B combination in the silicon wafer will be dissociated according to the equation of Fe—B→$Fe_{int}$+$B_{sub}$, during the activation step. It is noted that the activation step can be an optical excitation step (such as a light-irradiating process) instead of the 200° C. annealing process. Then diffusion length La of minority carriers in the activated silicon wafer is measured and recorded in step 2. Next, in step 3, the values of diffusion lengths Lb and La and a predetermined constant C are read. The constant C is the ideal value of (Lb—La)/Lb which is read from the plot of Lb and Lb—La, as shown in FIG. 2. As shown in the figure, the results from silicon wafers which contain the oxygen-precipitation defects are denoted by "Δ," while those without oxygen-precipitation defects are denoted as "o". The present value of (Lb—La)/Lb is calculated in step 4. The calculated (Lb—La)/Lb and constant C are compared in step 5 to determine whether the Fe—B concentration calculation should be carried out. If the comparison indicates that (Lb—La)/Lb is smaller than C, the calculation is terminated in step 6 since the silicon wafer contains oxygen-precipitation defects. Then step 1 starts again to calculate the Fe—B concentration of another silicon wafer. That is, the calculation of the Fe—B concentration in a silicon wafer containing oxygen-precipitation defects will not be completed beyond step 6. Alternatively, if the comparison in step 5 reveals that (Lb—La)/Lb is greater than C, the Fe—B concentration will be calculated in step 7 based on the formula [Fe—B]≈1×10$^{16}$(La$^{-2}$—Lb$^{-2}$). Finally, in step 8, the result is recorded to finish the calculation of the silicon wafer, and then a new calculation of another silicon wafer may start at step 1.

As stated above, the diffusion lengths Lb and La, which are obtained by the SPV method for Fe—B in an associated state and an dissociated state, respectively, are utilized to find the value of (Lb—La)/Lb. The value of (Lb—La)/Lb is compared with a predetermined value on the plot of Lb and Lb—La to verify if oxygen-precipitation defects exist in the wafer. Therefore, only the silicon wafers containing no oxygen-precipitation defects are subjected to calculation of the Fe—B concentration therein. Thus, the Fe—B concentration can be precisely determined even though the silicon wafers are mixed together with other silicon wafers which have a high-density of oxygen-precipitation defects.

What is claimed is:

1. A method of measuring a Fe—B concentration of a P-type silicon wafer, comprising the steps of:

measuring a diffusion length Lb of minority carriers in a P-type silicon wafer by the surface photovoltage method;

measuring a diffusion length La of minority carriers in the silicon wafer which has been activated to form dissociated $Fe_{int}$+$B_{sub}$ and then cooled rapidly;

calculating a value of (Lb—La)/Lb from the measured La and Lb;

comparing the calculated value with a predetermined value C obtained from a relationship between Lb—La and Lb;

determining that oxygen-precipitation defects are proved to exist in the silicon wafer and being terminated instead of proceeding with calculating the Fe—B concentration if the value of (Lb—La)/Lb is smaller than C; and calculating the Fe—B concentration from the measured La and Lb if the value of (Lb—La)/Lb is equal to and larger than C.

2. The method of measuring the Fe—B concentration, according to claim 1, wherein the predetermined value C is determined by comparing relationships between Lb—La and Lb in correlation graph with respect to both silicon wafers in which oxygen-precipitation defects exist and silicon wafers in which oxygen-precipitation defects do not exist.

3. A method of measuring a Fe—B concentration of a P-type silicon wafer, comprising the steps of:

determining a constant C based on measurements of diffusion length values Lb and La, where Lb and La are diffusion lengths of minority carriers in a plurality of P-type silicon wafers not having oxygen-precipitation defects respectively before and after an activation step measuring the diffusion length Lb of minority carries in the P-type silicon wafer by the surface photovoltage method;

activating minority carriers in the silicon wafer, cooling the silicon wafer rapidly, and measuring the diffusion length La of minority carries in the P-type silicon wafer by the surface photovoltage method, calculating a value (La—Lb)/Lb, and comparing the calculated value with the constant C; and if the calculated value is equal to or larger than the constant C indicating that no oxygen-precipitation defects exits in the P-type silicon wafer, proceeding with measuring the Fe—B concentration of the P-type silicon wafer; and if the calculated value is less than the constant C indicating that oxygen-precipitation defects exits in the P-type silicon wafer, not measuring the Fe—B concentration of the P-type silicon wafer.

4. The method of measuring the Fe—B concentration of claim 3, wherein the constant C is determined by plotting a relationship between (Lb—La) and Lb based on the measurements for the Lb and La of the plurality of P-type silicon wafers.

* * * * *